Patented Oct. 26, 1954

2,692,826

UNITED STATES PATENT OFFICE 2,692,826

LITHOGRAPHIC PLATES

Wilhelm Neugebauer, August Rebenstock, and Theo Scherer, Wiesbaden-Biebrich, Germany, assignors, by mesne assignments, to Azoplate Corporation, Summit, N. J., a corporation of New Jersey No Drawing. Application October 3, 1950, Serial No. 188,268

Claims priority, application Germany October 10, 1949

1 Claim. (Cl. 95—5.4)

The present invention relates to a process for the production of images which consist of a tanned colloid. When produced on a suitable base-material they may be used as lithographic printing plates. More particularly, the invention relates to lithographic plates made up of a base coated with a colloid substance made light sensitive by the addition of certain aromatic compounds.

The preparation of tanned images by the action of light on tannable colloids containing light-sensitive aromatic azido compounds is described in the German Patent No. 514,057 and in the French Patent No. 886,716. Due to the action of light the colloid loses its solubility when these azido compounds are present during the exposure. After exposure to light through a master those portions of the colloidal layer which have not been struck by light can be washed off, but the light struck portions are tanned or made insoluble. In this way negative tanned colloid images are produced if positive originals are used.

The tanned images thus obtained cannot be used immediately for lithographic purposes, because the tanned colloidal layer either is not receptive to printing inks or it possesses only poor mechanical stability, allowing at best the production of a limited number of copies.

When using these light-sensitive colloid layers containing azido compounds for the preparation of printing plates, the unexposed areas of the colloid layer were washed off, after the light-sensitive material had been exposed to light under a pattern, and until the present, the metallic surface of the base-material which was laid bare thereby was coated with a lacquer. Subsequently, the tanned colloid was removed, for example with water and brush. In this way, positive printing plates were obtained from positive patterns.

Now it has been found that extremely resistive images, particularly suited for use as lithographic printing plates for the flat printing process, can be obtained immediately from this type of negative working colloid layer sensitized by aromatic azido compounds provided on a suitable base, if after the exposure to light through a master and the removal of the unexposed portions of the colloid from the base, the remaining tanned colloid image is subjected to the influence of high temperatures. The base may, for example, consist of a foil made out of zinc, aluminum or other metallic or non-metallic material ordinarily used in the photo-lithographic process.

The colloid image already changed by the action of the light in the presence of the azido compounds, into an insoluble modification is made firmly adherent to the support and is given good receptiveness to fatty inks by the exposure to high temperatures.

The temperatures necessary for this process usually vary between 200–400° C. However, the optimum heating temperature depends on the specific composition of the layer, particularly on the type of colloid. Usually a distinctly visible change in the color of the image takes place during heating. The nature of the color change is such as to darken the image.

In order to be useful in the new process it is essential that the aromatic azido be capable of tanning the particular colloid used during exposure to light. Azido compounds selected from the group consisting of the azidostyryl-ketones and aromatic di-azido compounds are particularly useful. This group of azido compounds has been described in French Patent No. 886,716. Diazido compounds of the type represented for example by 1,5-diazido-naphthalene-3,7-disulfonic acid (sodium salt) may also be used.

Numerous substances can be uesd for the colloid component of the light-sensitive layer. Practically all soluble film-forming organic substances which can be hardened and possess colloidal properties may be used. As examples products selected from the group consisting of polyvinyl pyrrolidone, polyvinyl alcohol, polyacrylic acid or its salts, polyacrylic acid amide and its N-substitution products, gum arabic, glue, casein, glutein of wheat, egg albumin, photographic glue, fish glue, cellulose ethers, carboxy alkyl cellulose, and tragacanth may be used. Most of these colloid substances are soluble in water but there are some which must be dissolved in an organic solvent, for example alcohol, in order to get a solution capable of being coated on the base material. If the colloid used is soluble in water the azido compound or diazido compound added to the colloid must also be made water soluble, as for example by converting it into a water soluble salt.

Sensitizing agents, softeners, dyestuffs and other additions and auxiliaries ordinarily used in light-sensitive layers may be incorporated into these layers in the usual manner. The pictures obtained are negatives, if positive masters are used, and positives, if negative masters are used.

The following examples are inserted to illustrate the present invention and are not intended to limit the scope of the invention.

*Example 1*

An aluminum foil is whirl-coated with a solution consisting of:

100 parts of water
3 parts of polyvinyl pyrrolidone
0.3 part of 4,4'-diazidostilbene-2,2'-disulfonic acid sodium salt
0.3 part of eosin After drying by moderate heat the light-sensitive foil is exposed to light under a negative pattern. Subsequently, the portions of the colloid layer not struck by light are washed off with water, whereby a red positive colloid image becomes visible. After drying the foil is exposed to a temperature of 330°–350° C. for 5–10 minutes or the equivalent. This procedure can be carried out in an oven heated by means of gas or electricity.

Completion of this treatment can be clearly recognized. It occurs at the moment the originally red image turns to a dark brown color. The foil will be ready for use in printing after its usual fixation with an aqueous solution of gum arabic or dextrin to which a small quantity of phosphoric acid may be added.

Instead of the mentioned 4,4'-diazido-stilbene-2,2'-disulfonic acid sodium salt, other aromatic azides, as for example 1,5-diazido-naphthalene-3,7-disulfonic acid sodium salt, 4-azido-naphthalene-1,8-dicarboxylic acid sodium salt, 4,4' - diazido - diphenylmethane-3,5-dicarboxylic acid sodium salt and others, may be used.

*Example 2*

A zinc plate is coated with an aqueous solution in the same manner as described in connection with Example 1. This solution contains 4–5% of a copolymer of polyacrylic acid and polyacrylic acid amide and 0.9% of 4,4'-diazidostilbene-2,2'-disulfonic acid sodium salt. The coated plate is dried and exposed to light under a negative master. Subsequently, those areas not struck by light are washed off with water. As there is no dyestuff added to this layer, the tanned image can hardly be seen. It becomes clearly visible, however, if the layer is dyed with a 1% watery solution of methylene blue. In order to print with this blue positive colloid image, the plate is heated to 260° C. for 5 or 10 minutes and fixed.

*Example 3*

An aluminum plate is coated with a 3% aqueous solution of polyacrylic acid amide, containing 1% of 4,4'-diazidostilbene-2,2'-disulfonic acid sodium salt. This plate is treated as described in Example 2. A temperature of about 360° C. is necessary to harden the colloid.

*Example 4*

A glass plate is coated in the usual manner with a solution consisting of:

80 parts of alcohol
20 parts of water
3–4 parts of polyacrylic acid ammonium salt (of average viscosity)
1 part of 4,4'-diazidostilbene-2,2'-disulfonic acid sodium salt After exposure to light under a negative master, the plate is developed with water and dyed with a 1% aqueous solution of methylene blue, a positive image is obtained which is extraordinarily well anchored to the plate after subsequently heating for about 10 minutes at 200–240° C.

For the sake of brevity, the following examples are given in tabular form, the table lists the solution used for the preparation of the light-sensitive colloidal layer and the preferred temperature for hardening the tanned image:

*Example 5*

Coating solution:
100 parts of water
10 parts of glue (bone)
1 part of 4,4'-diazidostilbene-2,2'-disulfonic acid sodium salt
Temperature: 300° C.

*Example 6*

Coating solution:
100 parts of water
10 parts of casein
5 parts of ammonia 20%
1 part of 4-azidobenzalacetone-2-sulfonic acid sodium salt
Temperature: 280–300° C.

*Example 7*

Coating solution:
100 parts of water
5 parts of glutein of wheat
1 part of 4,4'-diazidostilbene-2,2'-disulfonic acid sodium salt
Temperature: 300° C.

*Example 8*

Coating solution:
100 parts of water
10 parts of gum arabic
1 part of 4,4'-diazidostilbene-2,2'-disulfonic acid sodium salt
Temperature: 300–330° C.

*Example 9*

Coating solution:
100 parts of water
3 parts of egg albumin
1 part of 4,4'-diazidostilbene-2,2'-disulfonic acid sodium salt
Temperature: 360° C.

*Example 10*

Coating solution:
100 parts of water
1 part of tragacanth
1 part of 4,4'-diazidostilbene-2,2'-disulfonic acid sodium salt
Temperature: 300° C.

*Example 11*

Coating solution:
100 parts of water
5 parts of photographic glue
1 part of 4,4'-diazidostilbene-2,2'-disulfonic acid sodium salt
Temperature: 300° C.

*Example 12*

Coating solution:
100 parts of water
5 parts of acrylic acid -N,N-dimethylamide
1 part of 4,4'-diazidostilbene-2,2'-disulfonic acid sodium salt
Temperature: 350° C.

*Example 13*

Coating solution:
- 100 parts of water
- 3 parts of cellulose glycolic acid sodium salt
- 1 part of 4,4′-diazidostilbene-2,2′-disulfonic acid sodium salt Temperature: 350–360° C.

Having thus fully described the invention, what is claimed is:

The process for the preparation of lithographic plates comprising the steps of coating a flexible metallic base with a solution containing polyvinylpyrrolidone and 4,4′-diazidostilbene-2,2′-disulfonic acid sodium salt to form a light sensitive colloid layer which can be tanned by light, exposing said light sensitive colloid layer to a light image, removing from the base material those portions of the colloid layer not struck by light and heating the plate to a temperature of 200° C. to 400° C. to transform said tanned image into a firmly adherent greasy ink receptive layer.

References Cited in the file of this patent

UNITED STATES PATENTS

| Number | Name | Date |
|---|---|---|
| 2,184,288 | Dangelmajer | Dec. 26, 1939 |
| 2,184,289 | Dangelmajer | Dec. 26, 1939 |
| 2,184,310 | Meigs | Dec. 26, 1939 |
| 2,184,311 | Meigs | Dec. 26, 1939 |
| 2,199,865 | Wood | May 7, 1940 |

FOREIGN PATENTS

| Number | Country | Date |
|---|---|---|
| 886,716 | France | July 12, 1943 |

OTHER REFERENCES

Clerc: "Ilford Manual of Process Work," Ilford Ltd., London, 4th ed. 1946, pp. 211–212.